United States Patent
Yu

(10) Patent No.: US 6,531,368 B1
(45) Date of Patent: Mar. 11, 2003

(54) METHOD OF FABRICATING A SEMICONDUCTOR DEVICE HAVING A METAL OXIDE HIGH-K GATE INSULATOR BY LOCALIZED LASER IRRADIATION AND A DEVICE THEREBY FORMED

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/825,750

(22) Filed: Apr. 3, 2001

(51) Int. Cl.[7] ............................................. H01L 21/336
(52) U.S. Cl. ...................... 438/306; 438/301; 438/203; 438/303
(58) Field of Search ................................ 438/270, 259, 438/439, 452, 287, 301, 585, 396, 653, 783

(56) References Cited

U.S. PATENT DOCUMENTS

| | | | | |
|---|---|---|---|---|
| 5,569,624 A | * | 10/1996 | Weiner | 438/285 |
| 6,020,024 A | * | 2/2000 | Maiti et al. | 427/248.1 |
| 6,037,235 A | * | 3/2000 | Narwankar et al. | 438/396 |
| 6,130,155 A | * | 10/2000 | Chen et al. | 438/635 |
| 6,147,375 A | * | 11/2000 | Yamazaki | 257/296 |

* cited by examiner

*Primary Examiner*—David Nelms
*Assistant Examiner*—D Le
(74) *Attorney, Agent, or Firm*—LaRiviere, Grubman & Payne, LLP

(57) ABSTRACT

A method of fabricating a semiconductor device, having a locally-formed metal oxide high-k gate insulator, involving: nitriding a substrate to form a thin silicon nitride layer; depositing a thin metal film on the thin silicon nitride layer; forming a localized metal oxide layer from the thin metal film, wherein the a thick nitride layer is deposited on the thin metal film, the thick nitride layer is patterned, the at least one exposed thin metal film portion is locally oxidized, by heating, wherein the oxidizing is performed by local laser irradiation; forming a gate stack having the localized metal oxide layer and a gate electrode, wherein the a thick gate material is deposited in the electrode cavity and on the localized metal oxide layer; the thick gate material is polished, thereby forming the gate electrode; and the thick nitride layer along with the at least one covered thin metal film portion are removed, thereby forming the gate stack; and completing fabrication of the device, and a device thereby formed.

18 Claims, 1 Drawing Sheet

US 6,531,368 B1

METHOD OF FABRICATING A SEMICONDUCTOR DEVICE HAVING A METAL OXIDE HIGH-K GATE INSULATOR BY LOCALIZED LASER IRRADIATION AND A DEVICE THEREBY FORMED

BACKGROUND OF THE INVENTION

1. Field of the Invention

The present invention relates to semiconductor devices and their methods of fabrication. More particularly, the present invention relates to the formation of gate stacks. Even more particularly, the present invention relates to forming a gate stack having a metal oxide high dielectric constant gate insulator with superior thermal stability and reduced diffusion into silicon-bearing semiconductor structures.

2. Description of the Background Art

Currently, the semiconductor industry has an interest in reducing the critical dimensions of transistors. As such, the thickness of the gate oxide must also be reduced. In so doing, the related art has faced problems associated with a significant increase in direct tunneling leakage current through a very thin gate oxide (i.e., <25 Angstroms). In an effort to suppress the severe gate leakage current, a high dielectric constant (high-k) material may be used as a gate dielectric, replacing a conventional thermal oxide. Several high-k materials (metal oxides) are good candidates for gate dielectric insulators: zirconia or zirconium dioxide ($ZrO_2$), hafnia or hafnium dioxide ($HfO_2$), titania or titanium dioxide ($TiO_2$), tantala or tantalum pentoxide ($Ta_2O_5$), and the like.

However, a high-k gate dielectric insulator, such as the foregoing metal oxides, must have a thickness which is much greater than that of a conventional thermal oxide to be similarly effective, because the direct current density is exponentially proportional to a dielectric layer's thickness. Thus, the direct tunneling current flow through a gate dielectric insulator may be significantly reduced, motivating its use in very small transistors. Another major problem with using a high-k material is thermal instability. High-k materials tend to diffuse into the silicon (Si) substrate, a poly-silicon (poly-Si) gate, or a polysilicon-germanium (poly-SiGe) gate during subsequent high temperature processing steps. Therefore, a need exists for a method of fabricating a semiconductor device having a locally-formed metal oxide high-k gate insulator with superior thermal stability which does not diffuse into the Si substrate, a poly-Si gate, or a poly-SiGe gate during subsequent high temperature processing steps.

BRIEF SUMMARY OF THE INVENTION

Accordingly, the present invention provides a method of fabricating a semiconductor device having a locally-formed metal oxide high-k gate insulator, and a device thereby formed. Generally, the present invention device comprises a metal oxide high-k gate insulator (i.e., a nitride/high-k material gate dielectric stack), wherein the nitride layer may be formed by a technique such as annealing in a gaseous nitrogen ($N_2$) ambient. The present invention method for fabricating the present device, generally comprises: nitriding a silicon substrate, thereby forming a thin silicon nitride ($Si_3N_y$, wherein $y \geq 4$, i.e., nitrogen-rich) layer on the substrate, wherein the nitrogen-rich surface provides superior resistance to metal diffusion into the substrate; depositing a thin metal film on the nitride layer; depositing a thick nitride film, such as silicon nitride ($Si_3N_4$); patterning the thick $Si_3N_4$ film, thereby exposing at least one portion of the thin metal film; and selectively forming a metal oxide layer by locally oxidizing the at least one exposed portion of the thin metal film, wherein the selective metal oxide layer forming step is performed by local laser irradiation, whereby the at least one thin metal film exposed portion is selectively heated for inducing reaction between the metal ions of the film and oxygen ions from the environment. This present invention device, so formed, has the advantages of providing sufficient diffusion resistance as well as thermal stability in a thin (i.e., small) feature size.

By way of example, and not of limitation, a semiconductor device having a locally-formed metal oxide high-k gate insulator with good thermal stability which does not diffuse into a Si substrate, a poly-Si gate, or a poly-SiGe gate when experiencing subsequent high temperature processes, may be fabricated according to the present invention by: (a) providing a substrate; (b) nitriding the substrate, thereby forming a thin silicon nitride (e.g., $Si_3N_y$, where $y \geq 4$) layer on the substrate; (c) depositing a high-k material, which may comprise a thin metal film, on the thin silicon nitride layer; (d) forming a localized metal oxide layer from the thin metal film, wherein the step (d) comprises (d)(1) depositing a thick $Si_3N_4$ layer on the high-k material, (d)(2) patterning the thick $Si_3N_4$ layer, thereby covering at least one portion of the thin metal film, thereby exposing at least one portion of the thin metal film, and thereby forming an electrode cavity, (d)(3) locally oxidizing, by heating, the at least one exposed thin metal film portion for inducing reaction between the metal ions of the at least one portion and oxygen ions from the environment, thereby forming the localized metal oxide layer, wherein the oxidizing is performed by local laser irradiation; (e) forming a gate stack comprising the localized metal oxide layer, wherein the step (e) may comprise (e)(1) depositing a thick gate material in the electrode cavity and on the localized metal oxide layer, wherein the thick gate material may comprise a material selected from a group consisting essentially of polysilicon poly-Si and poly-SiGe; (e)(2) polishing the thick gate material to a level which is flush to an upper surface of the thick $Si_3N_4$ layer, whereby the thick $Si_3N_4$ layer acts as a polish-stop, thereby forming a gate electrode; and (e)(3) removing the thick $Si_3N_4$ layer along with the at least one covered thin metal film portion, thereby forming the gate stack; and (f) completing fabrication of the semiconductor device, wherein step (f) may comprise the forming of a MOSFET structure comprising the stack.

Advantages of the present invention include suppressing severe gate leakage current and providing a locally-formed metal oxide high-k gate insulator with superior thermal stability which does not diffuse into the Si substrate, a poly-Si gate, or a poly-SiGe gate during subsequent high temperature processing steps. Further advantages of the invention will be explicated in the following portions of the specification, wherein the detailed description is for the purpose of fully disclosing preferred embodiments of the invention without thereon placing limitations.

BRIEF DESCRIPTION OF THE DRAWING

For a better understanding of the present invention, reference is made to the below-referenced accompanying Drawing which is for illustrative purposes and where like reference numbers denote like elements in the several figures of the Drawing.

DETAILED DESCRIPTION OF THE INVENTION

Figure 1:
FIG. 1 through FIG. 6, together, constitute a process flow diagram of the fabrication of a semiconductor device, in accordance with the present invention, wherein the semiconductor device is shown in cross-section at various stages of the process.

Referring more specifically to the several figures of the Drawing for illustrative purposes, the present invention is embodied in the apparatus and method generally shown in FIG. 1 through FIG. 6. These figures depict an embodiment of a process for fabricating a semiconductor device comprising a locally-formed metal oxide high-k gate insulator with superior thermal stability which does not diffuse into the Si substrate, a poly-Si gate, or a poly-SiGe gate during subsequent high temperature processing steps. Each figure illustrates a particular processing stage, and presents a side view in cross-section of the device at that stage of processing. However, that the apparatus may vary as to configuration and as to details of the parts, and that the method may vary as to the specific steps and sequence, without departing from the basic concepts as disclosed herein, will be appreciated.

Referring first to FIG. 1, in the first stage of processing, a substrate 10 being provided, wherein the substrate 10 may be deoxidized by heating the substrate 10 under a hydrogen ($H_2$) atmosphere, in accordance with the present invention.

Figure 2:
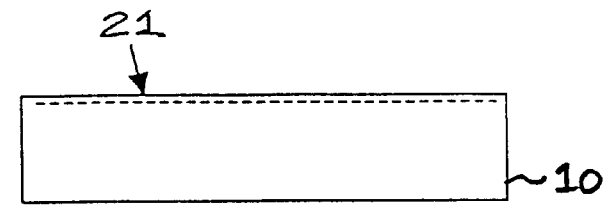

Next as shown in FIG. 2, an upper silicon surface of the substrate 10 has been nitrided by annealing the substrate 10 under $N_2$ atmosphere, thereby forming a thin silicon nitride layer 21 on the substrate 10, wherein the thin silicon nitride layer 21 may comprise a nitrogen-rich silicon nitride ($Si_3N_y$, wherein $y \geq 4$, i.e., nitrogen-rich).

Figure 3:
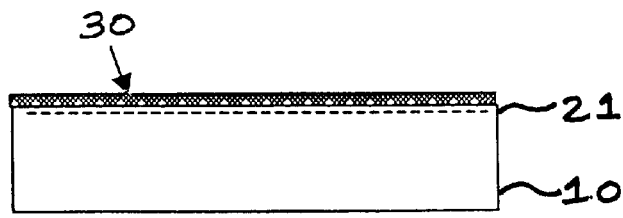

Next as shown in FIG. 3, a thin metal film 30 is deposited on the thin silicon nitride layer 21, wherein the thin metal film may comprise at least one metal selected from a group consisting essentially of zirconium (Zr), hafnium (Hf); titanium (Ti), and tantalum (Ta).

Figure 4:
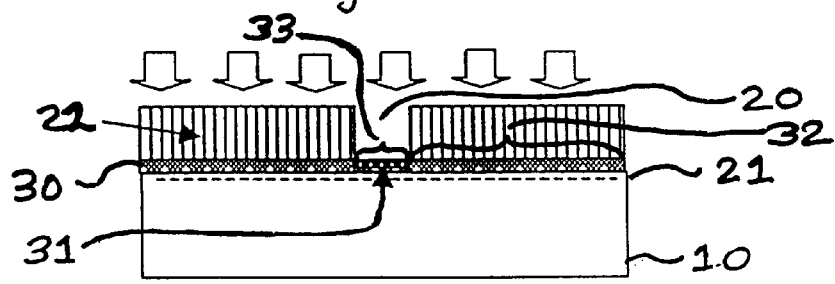

Next as shown in FIG. 4, a localized metal oxide layer 31 is formed from the thin metal film 30, wherein forming the localized metal oxide layer 31 comprises: depositing a thick $Si_3N_4$ layer 22 on the thin metal film 30; and patterning the thick $Si_3N_4$ layer 22, thereby covering at least one portion 32 of the thin metal film 30, thereby exposing at least one portion 33 of the thin metal film 30, and thereby forming an electrode cavity 20, wherein the patterning may be performed using a photoresist (not shown); locally oxidizing, by heating, the at least one exposed thin metal film portion 33 for inducing reaction between the metal ions of the at least one portion 33 and oxygen ions from the environment, thereby forming the localized metal oxide layer 31, wherein the oxidizing is performed by local laser irradiation, wherein the laser irradiation may be performed using an excimer laser, wherein the laser irradiation may be performed using a very short pulse in a range of approximately 1 nanosecond to approximately 20 nanoseconds, and wherein the laser irradiation may be performed for a duration in a range of approximately 1 nanosecond to approximately 20 nanoseconds.

Figure 5:
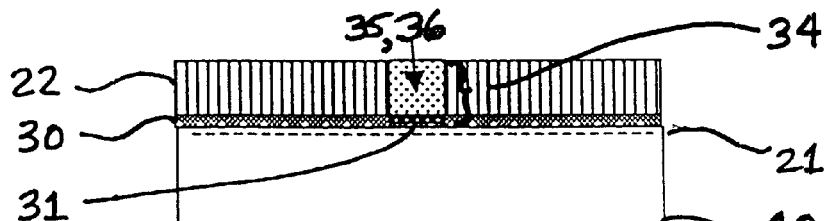

Next as shown in FIG. 5, a gate stack 34, comprising the localized metal oxide layer 31 and a gate electrode 36, is formed, wherein forming the gate stack 34 may comprise depositing a thick gate material 35 in the electrode cavity 20 and on the localized metal oxide layer 31, wherein the thick gate material 35 may comprise a material selected from a group consisting essentially of poly-Si and poly-SiGe; polishing the thick gate material 35 to a level which is flush to an upper surface of the patterned thick $Si_3N_4$ layer 22, whereby the thick $Si_3N_4$ layer 22 acts as a polish-stop, thereby forming the gate electrode 36; and removing the thick $Si_3N_4$ layer 22 along with the at least one covered thin metal film portion 32, thereby forming the gate stack 34.

Figure 6:
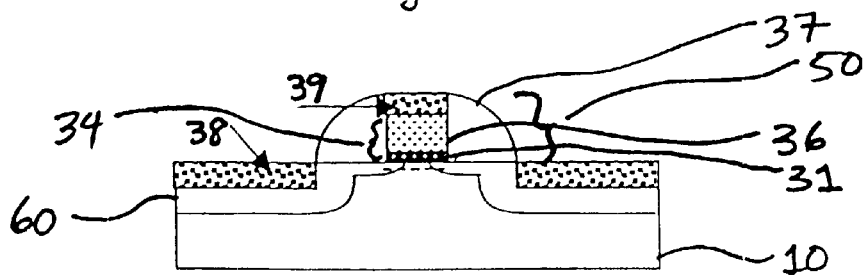
Figure 1:
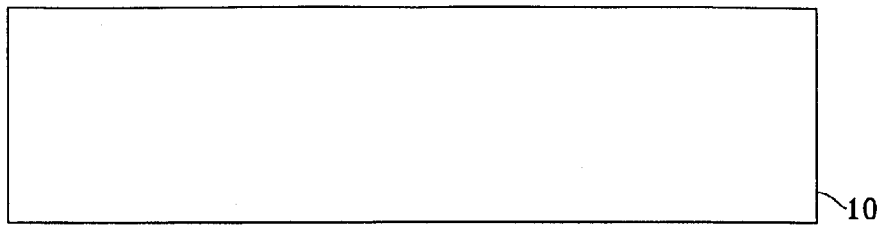
Figure 2:
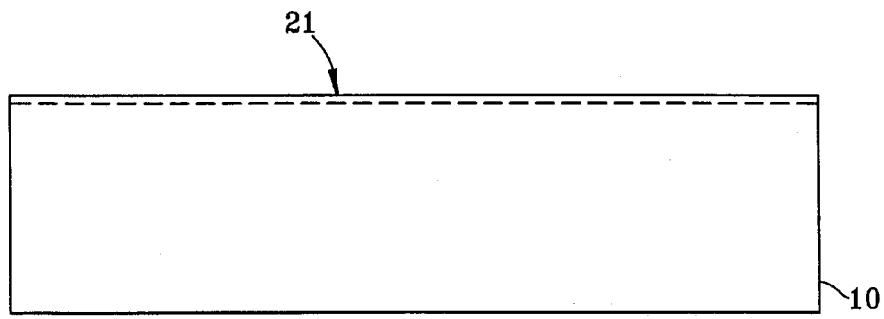
Figure 3:
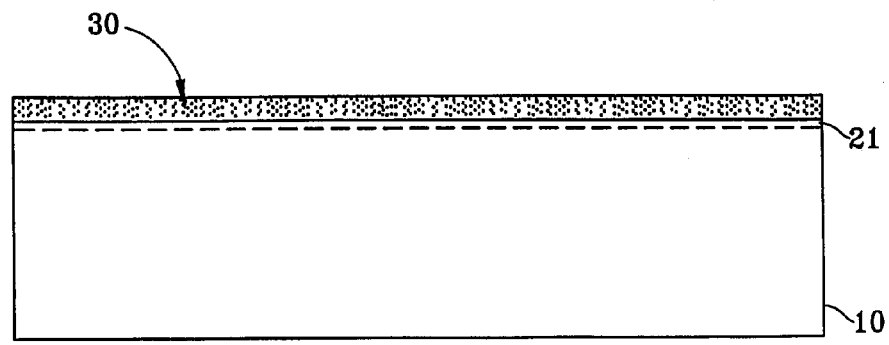
Figure 4:
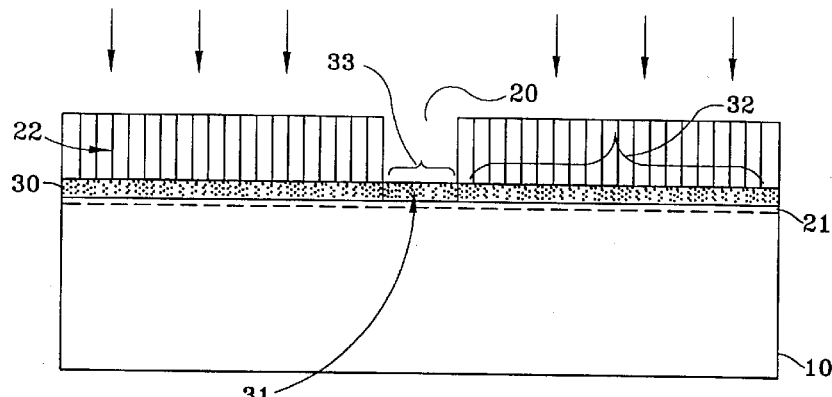
Figure 5:
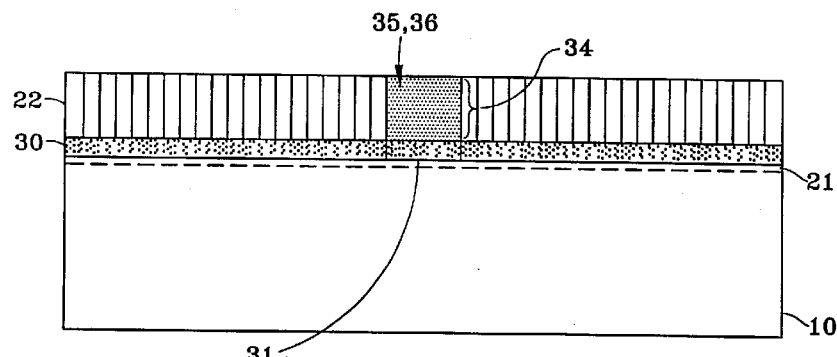
Figure 6:
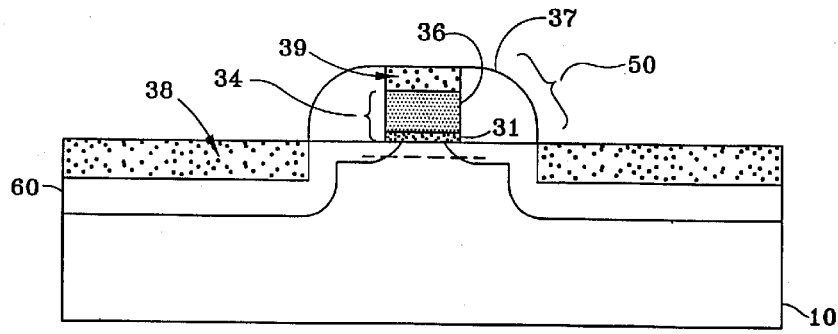

As depicted in FIG. 6, a MOSFET structure 50 is formed, the MOSFET comprising the stack 34, wherein the MOSFET structure 50 may further comprise a source/drain structure 60 formed in a shallow source/drain region 15 of the substrate 10 and flanking the stack 34, at least one spacer 37 formed on at least one sidewall of the stack 34, and a source/drain silicide 38 formed in the shallow source/drain region 15 and a gate silicide 39 formed on the stack 34, in accordance with the present invention.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims.

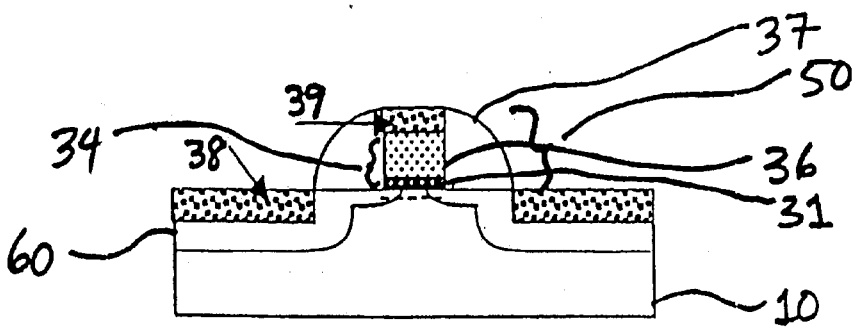

What is claimed is:

1. A method of fabricating a semiconductor device, having a localized metal oxide high-k gate insulator, comprising:

nitriding a semiconductor substrate, thereby forming a thin nitride layer on the substrate;

depositing a thin metal film on the thin nitride layer;

forming a localized metal oxide layer from the thin metal film by local laser irradiation, wherein the localized metal oxide layer forming step comprises:

depositing a thick nitride layer on the thin metal film;

patterning the thick nitride layer, thereby covering at least one portion of the thin metal film, thereby exposing at least one portion of the thin metal film, and thereby forming an electrode cavity over the at least one exposed thin metal film portion, wherein the thick nitride layer patterning is performed using a photoresist; and locally oxidizing, by heating, the at least one exposed thin metal film portion for inducing reaction between the metal ions of the at least one portion and oxygen ions from the environment, thereby forming the localized metal oxide layer;

forming a gate stack comprising the localized metal oxide layer and a gate electrode; and completing fabrication of the semiconductor device.

2. A method, as recited in claim 1,
wherein the substrate comprises a material selected from a group consisting essentially of a silicon wafer or a silicon-on-insulator (SOI) wafer, and
wherein the substrate is deoxidized by heating the substrate under a hydrogen ($H_2$) atmosphere before nitriding the substrate.

3. A method, as recited in claim 1, wherein the nitriding step is performed by annealing the substrate under a nitrogen ($N_2$) atmosphere.

4. A method, as recited in claim 1, wherein the thin nitride layer comprises a nitrogen-rich silicon nitride ($Si_3N_y$), where $y \geq 4$.

5. A method, as recited in claim 1, wherein the thin metal film comprises at least one metal selected from a group consisting essentially of zirconium (Zr), hafnium (Hf), titanium (Ti), and tantalum (Ta).

6. A method, as recited in claim 1, wherein the gate stack forming step comprises:
depositing a thick gate material in the electrode cavity and on the localized metal oxide layer,
wherein the thick gate material comprises a material selected from a group consisting essentially of polysilicon (poly-Si) and polysilicon-germanium (poly-SiGe);
polishing the thick gate material to a level which is flush to an upper surface of the thick nitride layer, whereby the thick nitride layer acts as a polish-stop, thereby forming the gate electrode; and
removing the thick nitride layer along with the at least one covered thin metal film portion, thereby forming the gate stack.

7. A method, as recited in claim 1,
wherein the completing step comprises the forming of a MOSFET structure comprising the stack, and
wherein the completing step further comprises:
forming a source/drain structure in a shallow source/drain region of the substrate and flanking the stack;
forming at least one spacer on at least one sidewall of the stack;
forming a source/drain silicide in the shallow source/drain region; and
forming a gate silicide on the stack.

8. A method, as recited in claim 1, wherein the laser irradiation is performed using an excimer laser.

9. A method, as recited in claim 8, wherein the laser irradiation is performed using a very short pulse in a range of approximately 1 nanosecond to approximately 20 nanoseconds.

10. A method, as recited in claim 8, wherein the laser irradiation is performed for a duration in a range of approximately 1 nanosecond to approximately 20 nanoseconds.

11. A method of fabricating a semiconductor device, having a localized metal oxide high-k gate insulator, comprising:
nitriding a semiconductor substrate, thereby forming a thin nitride layer on the substrate,
wherein the substrate comprises a material selected from a group consisting essentially of a silicon wafer or a silicon-on-insulator (SOI) wafer, and
wherein the substrate is deoxidized by heating the substrate under a hydrogen ($H_2$) atmosphere before nitriding the substrate;
depositing a thin metal film on the thin nitride layer;
forming a localized metal oxide layer from the thin metal film by local laser irradiation,
wherein the localized metal oxide layer forming step comprises:
depositing a thick nitride layer on the thin metal film;
patterning the thick nitride layer, thereby covering at least one portion of the thin metal film, thereby exposing at least one portion of the thin metal film, and thereby forming an electrode cavity over the at least one exposed thin metal film portion, wherein the thick nitride layer patterning is performed using a photoresist; and
locally oxidizing, by heating, the at least one exposed thin metal film portion for inducing reaction between the metal ions of the at least one portion and oxygen ions from the environment, thereby forming the localized metal oxide layer;
forming a gate stack comprising the localized metal oxide layer and a gate electrode; and
completing fabrication of the semiconductor device.

12. A method, as recited in claim 11,
wherein the nitriding step is performed by annealing the substrate under a nitrogen ($N_2$) atmosphere, and
wherein the thin nitride layer comprises a nitrogen-rich silicon nitride ($Si_3N_y$), where $y \geq 4$.

13. A method, as recited in claim 12, wherein the thin metal film comprises at least one metal selected from a group consisting essentially of zirconium (Zr), hafnium (Hf), titanium (Ti), and tantalum (Ta).

14. A method, as recited in claim 13, wherein the gate stack forming step comprises:
depositing a thick gate material in the electrode cavity and on the localized metal oxide layer, wherein the thick gate material comprises a material selected from a group consisting essentially of polysilicon (poly-Si) and polysilicon-germanium (poly-SiGe);
polishing the thick gate material to a level which is flush to an upper surface of the thick nitride layer, whereby the thick nitride layer acts as a polish-stop, thereby forming the gate electrode; and
removing the thick nitride layer along with the at least one covered thin metal film portion, thereby forming the gate stack.

15. A method, as recited in claim 14,
wherein the completing step comprises the forming of a MOSFET structure comprising the stack, and
wherein the completing step further comprises:
forming a source/drain structure in a shallow source/drain region of the substrate and flanking the stack;
forming at least one spacer on at least one sidewall of the stack;
forming a source/drain silicide in the shallow source/drain region; and
forming a gate silicide on the stack.

16. A method, as recited in claim 15, wherein the laser irradiation is performed using an excimer laser.

17. A method, as recited in claim 16,
wherein the laser irradiation is performed using a very short pulse in a range of approximately 1 nanosecond to approximately 20 nanoseconds), and
wherein the laser irradiation is performed for a duration in a range of approximately 1 nanosecond to approximately 20 nanoseconds.

18. A semiconductor device, having a localized metal oxide high-k gate insulator, comprising:

a semiconductor substrate having a thin nitride layer formed thereon;

a thin metal film deposited on the thin nitride layer;

a laser irradiated localized metal oxide layer formed on the thin metal film;

a gate stack comprising the laser irradiated localized metal oxide layer and a gate electrode formed on the substrate;

a source/drain structure formed in a shallow source/drain region of the substrate and flanking the stack;

at least one spacer formed on at least one sidewall of the gate stack;

a source/drain silicide formed in the shallow source/drain region; and a gate silicide formed on the gate stack.

* * * * *

UNITED STATES PATENT AND TRADEMARK OFFICE
CERTIFICATE OF CORRECTION

PATENT NO.   : 6,531,368 B1
DATED        : March 11, 2003
INVENTOR(S)  : Bin Yu

It is certified that error appears in the above-identified patent and that said Letters Patent is hereby corrected as shown below:

The title page showing the illustrative figure should be replaced with the attached title page.

In the drawings replace the drawing Fig. 1-6 as shown on attached page.

Signed and Sealed this

Fifteenth Day of July, 2003

JAMES E. ROGAN
*Director of the United States Patent and Trademark Office*

(12) United States Patent
Yu

(10) Patent No.: US 6,531,368 B1
(45) Date of Patent: Mar. 11, 2003

(54) METHOD OF FABRICATING A SEMICONDUCTOR DEVICE HAVING A METAL OXIDE HIGH-K GATE INSULATOR BY LOCALIZED LASER IRRADIATION AND A DEVICE THEREBY FORMED

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/825,750

(22) Filed: Apr. 3, 2001

(51) Int. Cl.$^7$ ............................................. H01L 21/336
(52) U.S. Cl. ...................... 438/306; 438/301; 438/203; 438/303
(58) Field of Search ............................ 438/270, 259, 438/439, 452, 287, 301, 585, 396, 653, 783

(56) References Cited

U.S. PATENT DOCUMENTS

| | | | |
|---|---|---|---|
| 5,569,624 A | * 10/1996 | Weiner | 438/285 |
| 6,020,024 A | * 2/2000 | Maiti et al. | 427/248.1 |
| 6,037,235 A | * 3/2000 | Narwankar et al. | 438/396 |
| 6,130,155 A | * 10/2000 | Chen et al. | 438/635 |
| 6,147,375 A | * 11/2000 | Yamazaki | 257/296 |

* cited by examiner

*Primary Examiner*—David Nelms
*Assistant Examiner*—D Le
(74) *Attorney, Agent, or Firm*—LaRiviere, Grubman & Payne, LLP

(57) ABSTRACT

A method of fabricating a semiconductor device, having a locally-formed metal oxide high-k gate insulator, involving: nitriding a substrate to form a thin silicon nitride layer; depositing a thin metal film on the thin silicon nitride layer; forming a localized metal oxide layer from the thin metal film, wherein the a thick nitride layer is deposited on the thin metal film, the thick nitride layer is patterned, the at least one exposed thin metal film portion is locally oxidized, by heating, wherein the oxidizing is performed by local laser irradiation; forming a gate stack having the localized metal oxide layer and a gate electrode, wherein the a thick gate material is deposited in the electrode cavity and on the localized metal oxide layer; the thick gate material is polished, thereby forming the gate electrode; and the thick nitride layer along with the at least one covered thin metal film portion are removed, thereby forming the gate stack; and completing fabrication of the device, and a device thereby formed.

18 Claims, 2 Drawing sheets